United States Patent
Shinozaki

(10) Patent No.: US 9,687,958 B2
(45) Date of Patent: Jun. 27, 2017

(54) WET TREATMENT APPARATUS AND SUBSTRATE TREATMENT APPARATUS PROVIDED WITH THE SAME

(71) Applicant: Ebara Corporation, Tokyo (JP)

(72) Inventor: Hiroyuki Shinozaki, Tokyo (JP)

(73) Assignee: Ebara Corporation, Tokyo (JP)

( * ) Notice: Subject to any disclaimer, the term of this patent is extended or adjusted under 35 U.S.C. 154(b) by 368 days.

(21) Appl. No.: 14/450,738

(22) Filed: Aug. 4, 2014

(65) Prior Publication Data

US 2015/0042028 A1 Feb. 12, 2015

(30) Foreign Application Priority Data

Aug. 7, 2013 (JP) .................................. 2013-163841

(51) Int. Cl.
*B24B 41/02* (2006.01)
*H01L 21/67* (2006.01)
(Continued)

(52) U.S. Cl.
CPC .............. *B24B 41/02* (2013.01); *B24B 37/10* (2013.01); *H01L 21/67051* (2013.01);
(Continued)

(58) Field of Classification Search
CPC ......... B24B 57/00; B24B 57/02; B24B 41/02; B24B 37/10; H01L 21/67051; H01L 21/67; Y10S 134/902; B08B 3/02
(Continued)

(56) References Cited

U.S. PATENT DOCUMENTS 4,788,994 A * 12/1988 Shinbara ................. B05C 11/08
118/54
5,677,000 A * 10/1997 Yoshioka ............ H01L 21/6715
118/52
(Continued)

FOREIGN PATENT DOCUMENTS

EP 0827814 A1 3/1998
GB 732103 * 6/1955
(Continued)

OTHER PUBLICATIONS

International Property Office of Singapore, Search Report and Written Opinion of Singaporean Application No. 10201404673P (Oct. 24, 2016).

*Primary Examiner* — Monica Carter
*Assistant Examiner* — Mahdi H Nejad
(74) *Attorney, Agent, or Firm* — Leydig, Voit & Mayer, Ltd.

(57) ABSTRACT

The present invention provides a wet treatment apparatus having divided base frames and waterproofing pans, which has an enhanced waterproofing property and can be easily assembled. A wet treatment apparatus 10 is provided with a first base frame 13 and a second base frame 14. In addition, a first waterproofing pan 15 is arranged on a mounting surface 13a of the first base frame 13, and a second waterproofing pan 16 is arranged on a mounting surface 14a of the second base frame 14. A plate-shaped structure 17 having flexibility is provided on an end 15a of the first waterproofing pan 15. The plate-shaped structure 17 is configured to cover a gap between the end 15a of the first waterproofing pan 15 and an end 16a of the second waterproofing pan 16, and can waterproof a space between the end 15a of the first waterproofing pan 15 and the end 16a of the second waterproofing pan 16.

12 Claims, 5 Drawing Sheets

(51) Int. Cl.
  *B24B 37/10* (2012.01)
  *B08B 3/02* (2006.01)
  *B24B 57/02* (2006.01)

(52) U.S. Cl.
  CPC ............ *B08B 3/02* (2013.01); *B24B 57/02* (2013.01); *H01L 21/6708* (2013.01); *Y10S 134/902* (2013.01)

(58) Field of Classification Search
  USPC ..... 451/87, 88, 446, 447; 134/902, 1.2, 153, 134/33, 104.2; 118/52; 137/312, 315.42; 269/289 R
  See application file for complete search history.

(56) References Cited

U.S. PATENT DOCUMENTS

| | | | | |
|---|---|---|---|---|
| 5,689,749 A * | 11/1997 | Tanaka | ............ | G03F 7/3021 396/611 |
| 5,718,763 A * | 2/1998 | Tateyama | ............ | B05C 11/08 118/319 |
| 5,762,708 A * | 6/1998 | Motoda | ............ | B05C 11/08 118/319 |
| 5,871,584 A * | 2/1999 | Tateyama | ............ | G03F 7/3021 118/319 |
| 5,893,794 A * | 4/1999 | Togawa | ............ | H01L 21/67766 451/339 |
| 5,940,651 A * | 8/1999 | Pike | ............ | B05C 11/08 118/52 |
| 5,985,357 A * | 11/1999 | Sanada | ............ | B05C 11/08 118/320 |
| 5,997,653 A * | 12/1999 | Yamasaka | ............ | B08B 3/02 134/102.1 |
| 6,159,288 A * | 12/2000 | Satou | ............ | B05C 11/08 118/52 |
| 6,230,721 B1 | 5/2001 | Miyasako | | |
| 6,332,723 B1 * | 12/2001 | Matsuyama | ............ | G03F 7/3021 134/105 |
| 6,494,220 B1 * | 12/2002 | Matsuda | ............ | B08B 1/04 118/52 |
| 6,527,860 B1 * | 3/2003 | Yoshihara | ............ | H01L 21/6715 118/50 |
| 6,589,338 B1 * | 7/2003 | Nakamori | ............ | H01L 21/67051 118/50 |
| 6,793,769 B2 * | 9/2004 | Kajino | ............ | C03C 15/00 134/33 |
| 6,807,972 B2 * | 10/2004 | Chiu | ............ | B08B 3/02 134/103.2 |
| 7,048,800 B2 * | 5/2006 | Nguyen | ............ | H01L 21/67051 118/501 |
| 7,063,094 B2 * | 6/2006 | Amai | ............ | B08B 3/04 134/104.1 |
| 7,553,374 B2 * | 6/2009 | Hamada | ............ | H01L 21/6715 118/313 |
| 8,201,568 B2 * | 6/2012 | Ito | ............ | B08B 3/04 134/104.2 |
| 8,881,751 B2 * | 11/2014 | Ogata | ............ | H01L 21/67051 134/153 |
| 2001/0041229 A1 * | 11/2001 | Sakamoto | ............ | B05D 1/005 427/555 |
| 2002/0043275 A1 * | 4/2002 | Okuda | ............ | B08B 3/024 134/30 |
| 2002/0119732 A1 * | 8/2002 | Panagian | ............ | B24B 23/03 451/28 |
| 2003/0164356 A1 * | 9/2003 | Tanaka | ............ | B24B 57/02 216/89 |
| 2003/0183250 A1 * | 10/2003 | Rodney Chiu | ............ | B08B 3/02 134/30 |
| 2003/0196686 A1 * | 10/2003 | Chiu | ............ | B08B 3/02 134/33 |
| 2004/0226582 A1 * | 11/2004 | Satoshi | ............ | B08B 3/08 134/25.4 |
| 2006/0048792 A1 * | 3/2006 | Nakamura | ............ | B08B 3/02 134/2 |
| 2007/0163711 A1 * | 7/2007 | Koo | ............ | H01L 21/6708 156/345.1 |
| 2008/0070418 A1 * | 3/2008 | Miyagi | ............ | H01L 21/67051 438/745 |
| 2008/0092813 A1 * | 4/2008 | Nakashima | ............ | G03F 7/162 118/712 |
| 2011/0240220 A1 * | 10/2011 | Schoeb | ............ | H01L 21/67051 156/345.14 |
| 2012/0289128 A1 * | 11/2012 | Liu | ............ | B24B 37/107 451/64 |
| 2012/0289133 A1 * | 11/2012 | Liu | ............ | B24B 37/34 451/443 |
| 2013/0115862 A1 * | 5/2013 | Rangarajan | ............ | B24B 27/0023 451/64 |
| 2014/0060424 A1 * | 3/2014 | Sugiyama | ............ | H01L 21/6715 118/52 |
| 2014/0069890 A1 * | 3/2014 | Yavelberg | ............ | B24B 37/34 216/53 |
| 2014/0129031 A1 * | 5/2014 | Carter | ............ | E03B 3/02 700/275 |

FOREIGN PATENT DOCUMENTS

| | | | |
|---|---|---|---|
| GB | 000732103 A | * | 6/1955 |
| JP | 09-207047 A | | 8/1997 |
| JP | 09-234688 A | | 9/1997 |
| JP | 2006-336285 A | | 12/2006 |
| JP | 2006336285 | * | 12/2006 |
| JP | 2009138415 A | * | 6/2009 |
| KR | 1020110100136 A | | 9/2011 |

* cited by examiner

15a (a)

15a (b)

WET TREATMENT APPARATUS AND SUBSTRATE TREATMENT APPARATUS PROVIDED WITH THE SAME

CROSS-REFERENCE TO RELATED APPLICATION

This application claims priority to and the benefit of Japanese patent application No. 2013-163841 filed Aug. 7, 2013, the entire contents of which are herein incorporated by reference.

BACKGROUND OF THE INVENTION

Field of the Invention

The present invention relates to a wet treatment apparatus which can be divided and assembled, and to a substrate treatment apparatus provided with the same.

Description of the Related Art

In a process of manufacturing a semiconductor wafer, conventionally, a CMP (Chemical Mechanical Polishing) apparatus is used in order to polish and flatten the surface of the semiconductor wafer.

This CMP apparatus is generally provided with a polishing table for rotating a polishing pad, a top ring for pressing a substrate (semiconductor wafer) to the polishing pad, and a dressing ring for dressing the polishing pad. The CMP apparatus polishes the substrate by supplying a polishing liquid which contains a polishing material, to the upper face of the polishing pad from a slurry line, and bringing the substrate held by the top ring into contact with the polishing pad on the rotating polishing table, and also dresses and regenerates the surface of the polishing pad which has finished polishing by bringing the dressing ring into contact with the polishing pad.

Furthermore, a conveying apparatus is occasionally installed in parallel to this CMP apparatus. This conveying apparatus, for instance, receives the substrate from a cassette which accommodates the substrate therein, and delivers the substrate to the top ring of the CMP apparatus. The substrate of which the treatment has been finished is received by the conveying apparatus again, is dried, for instance, in a drying apparatus, and is then accommodated by the cassette.

In the substrate treatment apparatus in which a liquid is used in the treatment process, as in this CMP apparatus, a wet treatment apparatus having a waterproofing pan is provided in order to prevent the leakage of the liquid.

FIG. 6 is a schematic side view illustrating an example of a conventional wet treatment apparatus.

As is illustrated in FIG. 6, the wet treatment apparatus 100 is provided with a base frame 101 having high rigidity for mounting the main body of the substrate treatment apparatus and the conveying apparatus thereon, and a plurality (here, two) of waterproofing pans 102 which are designed so as to fit the size of the base frame 101 are arranged on the base frame 101 so that the ends thereof overlap one another. The waterproofing pan 102 is configured to be capable of receiving a treatment liquid thereinto which has been used in the substrate treatment, and prevents the treatment liquid from leaking to the outside of the apparatus.

Thus, the waterproofing pan 102 is arranged on the base frame 101 having high rigidity, and thereby prevents a waterproofing function of the substrate treatment apparatus from deteriorating due to a damage of the waterproofing pan 102 originating from the transportation, carrying in and installation of the substrate treatment apparatus to a semiconductor manufacturing plant, further a trial operation, and the like.

Furthermore, in addition to this wet treatment apparatus, such a method is also known to arrange a plurality of waterproofing pans on one base frame so as to be separated from each other and to cover a space between the ends of the separated waterproofing pans with another member.

However, the semiconductor manufacturing plant is designed so as to accept only the apparatus which satisfies an apparatus size and a standard weight value specified by a SEMI-E72 Standard, and in recent years, the size of the substrate treatment apparatus is increasing along with the increase in the size of a semiconductor wafer that is a treated substrate. Accordingly, it becomes difficult to carry the substrate treatment apparatus into a clean room of the semiconductor manufacturing plant, and to move the apparatus in the clean room.

For this reason, in order to make the apparatus size compliant with the SEMI-E72 Standard, and convey the wet treatment apparatus to the clean room, it is necessary to divide and sub-modularize the base frame and the waterproofing pan.

However, the apparatus structure of the semiconductor manufacturing apparatus such as the substrate treatment apparatus has been improved in order to minimize a foot print (occupation area of apparatus) and maximize productivity (number of treated substrate per hour/foot print), and accordingly the apparatus structure is complicated. In the case of the substrate treatment apparatus having the wet treatment apparatus, in particular, the base frame and the waterproofing pan form complicated structures.

In the case where such a base frame and a waterproofing pan have been divided, when the divided base frames and waterproofing pans are carried into the clean room and are assembled, it is required to secure the waterproofing function in the divided portion of the waterproofing pan and facilitate assembly.

FIG. 7 is a view illustrating a process of assembling a conventional wet treatment apparatus which is provided with divided base frames and waterproofing pans.

As is illustrated in FIG. 7A, a wet treatment apparatus 110 has a first base frame 111 and a second base frame 112. In addition, the first base frame 111 has a first waterproofing pan 113 which is designed so as to fit the size of the first base frame 111 arranged thereon, and the second base frame 112 has a second waterproofing pan 114 which is designed so as to fit the size of the second base frame 112 arranged thereon.

Because these first waterproofing pan 113 and second waterproofing pan 114 keep their shapes by being supported by the first base frame 111 and the second base frame 112, it is difficult to separate the respective waterproofing pans from the first base frame 111 and the second base frame 112. In addition, as has been described above, in the case of the substrate treatment apparatus having the wet treatment apparatus, the base frame and the waterproofing pan form complicated structures. Specifically, in the present conventional example, the heights of the first base frame 111 and the second base frame 112 are different from each other, and the shapes of the waterproofing pans are also configured to be curved so as to fit the heights.

For this reason, in order to assemble these divided base frames and waterproofing pans so that the divided waterproofing pans are not damaged, the first base frame 111 is, for instance, hoisted with a not-shown crane, as is illustrated in FIG. 7B, and the first base frame 111 is arranged so as to be adjacent to the second base frame 112 so that the first waterproofing pan 113 and the second waterproofing pan 114 do not come in contact with each other, as is illustrated in FIG. 7C.

Subsequently, as is illustrated in FIG. 7D, the first base frame 111 is lowered so that the end of the first waterproofing pan 113 overlaps the end of the second waterproofing pan 114 from the above.

As has been described above, the process of connecting and assembling the divided base frames and waterproofing pans includes a step of connecting the base frame structures to each other, and a step of adjusting the divided faces of the waterproofing pans, and accordingly it becomes an extremely difficult and laborious operation to connect the base frames so that the divided faces of the waterproofing pans are not damaged. In addition, a gap is formed between the ends in a state in which the ends of the divided waterproofing pans just overlap one another, and accordingly a waterproofing effect has been insufficient.

CITATION LIST

Patent Literature

Patent Literature 1: Japanese Patent Laid-Open No. 9-207047
Patent Literature 2: Japanese Patent Laid-Open No. 9-234688

The present invention is designed with respect to the above described conventional problems, and one object of the present invention is to enhance a waterproofing property of a wet treatment apparatus having divided base frames and waterproofing pans. In addition, another object thereof is to easily assemble the wet treatment apparatus having the divided base frames and waterproofing pans.

SUMMARY OF THE INVENTION

In order to achieve the above described object, a wet treatment apparatus according to one embodiment of the present invention includes: a first base frame; a second base frame which is arranged so as to be adjacent to the first base frame; a first waterproofing pan which is installed on an upper face of the first base frame; a second waterproofing pan which is installed on an upper face of the second base frame; and a structure which is attached to the first waterproofing pan or the second waterproofing pan, is configured to waterproof a gap between the first waterproofing pan and the second waterproofing pan, and has flexibility.

A wet treatment apparatus according to another embodiment of the present invention is configured so that at least one part of the end of the first waterproofing pan overlaps an end of the second waterproofing pan in planar view, and the structure is attached to the end of the first waterproofing pan or the end of the second waterproofing pan.

In a wet treatment apparatus according to another embodiment of the present invention, the end of the first waterproofing pan is arranged in a higher position than the end of the second waterproofing pan.

In a wet treatment apparatus according to another embodiment of the present invention, the structure is formed from synthetic resin or metal, and has lower rigidity than the first base frame and the second base frame.

In a wet treatment apparatus according to another embodiment of the present invention, the structure is formed into a plate shape, a brush shape or a blinds shape.

In a wet treatment apparatus according to another embodiment of the present invention, the first base frame is configured to be capable of mounting a substrate treatment apparatus thereon, and the second base frame is configured to be capable of mounting a substrate conveying apparatus thereon.

In order to achieve the above described object, a substrate treatment apparatus according to one embodiment of the present invention includes the above described wet treatment apparatus.

According to the present invention, a waterproofing property of a wet treatment apparatus having divided base frames and waterproofing pans can be enhanced. In addition, the wet treatment apparatus having the divided base frames and waterproofing pans can be easily assembled.

DETAILED DESCRIPTION OF THE PREFERRED EMBODIMENTS

Figure 1:
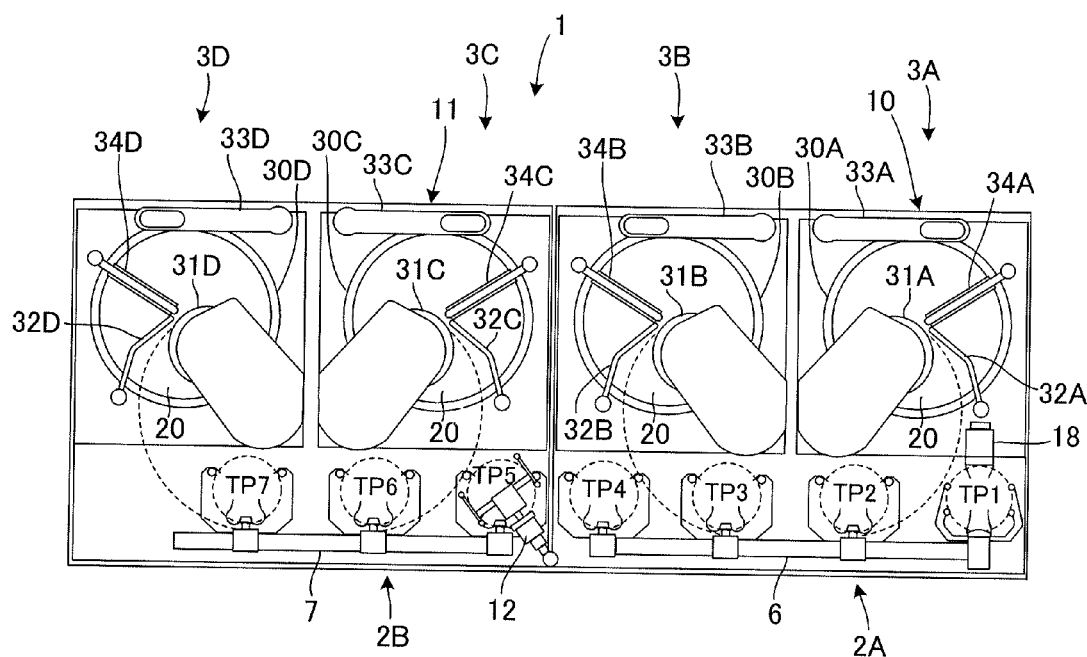
FIG. 1 is a plan view schematically illustrating a CMP apparatus which is provided with a wet treatment apparatus according to the present embodiment.

A wet treatment apparatus and a substrate treatment apparatus provided with the same according to an embodiment of the present invention will be described below with reference to the drawings. In the drawings which will be described below, the same or corresponding components are designated by the same reference numerals, and overlapping descriptions will be omitted. In the following embodiment, a CMP apparatus will be described below as an example of a substrate treatment apparatus, but the substrate treatment apparatus is not limited to the CMP apparatus, and includes, for instance, substrate treatment apparatuses in which a liquid is used for a treatment process, such as a cleaning apparatus (for wafer, reticle, cassette and the like) and a plating apparatus.

FIG. 1 is a plan view schematically illustrating a CMP apparatus which is provided with a wet treatment apparatus according to the present embodiment.

As is illustrated in FIG. 1, this CMP apparatus 1 includes: a first polishing unit 3A, a second polishing unit 3B, a third polishing unit 3C and a fourth polishing unit 3D; and a first conveying mechanism 2A for conveying a substrate to the first polishing unit 3A and the second polishing unit 3B, and a second conveying mechanism 2B for conveying the substrate to the third polishing unit 3C and the fourth polishing unit 3D. The CMP apparatus 1 further includes: a wet treatment apparatus 10 for receiving a liquid produced while the substrate is treated, in the first polishing unit 3A, the second polishing unit 3B and the first conveying mechanism 2A; and a wet treatment apparatus 11 for receiving a liquid produced while the substrate is treated, in the third polishing unit 3C, the fourth polishing unit 3D and the second conveying mechanism 2B.

The first polishing unit 3A is provided with a polishing table 30A on which a polishing pad 20 having a polishing surface is attached; a top ring 31A for holding a wafer and polishing the wafer while pressing the wafer to the polishing pad 20 on the polishing table 30A; a polishing-liquid supplying nozzle 32A for supplying a polishing liquid or a dressing liquid (for instance, pure water) to the polishing pad 20; a dresser 33A for dressing the polishing surface of the polishing pad 20; and an atomizer 34A which converts a mixed fluid of a liquid (for instance, pure water) and a gas (for instance, nitrogen gas) or a liquid (for instance, pure water) into mist and jets the mist onto the polishing surface.

Similarly, the second polishing unit 3B is provided with a polishing table 30B on which the polishing pad 20 is attached; a top ring 31B; a polishing-liquid supplying nozzle 32B; a dresser 33B; and an atomizer 34B. The third polishing unit 3C is provided with a polishing table 30C on which the polishing pad 20 is attached; a top ring 31C; a polishing-liquid supplying nozzle 32C; a dresser 33C; and an atomizer 34C. The fourth polishing unit 3D is provided with a polishing table 30D on which the polishing pad 20 is attached; a top ring 31D; a polishing-liquid supplying nozzle 32D; a dresser 33D; and an atomizer 34D.

The first conveying mechanism 2A has a first linear transporter 6 which is arranged so as to be adjacent to the first polishing unit 3A and the second polishing unit 3B. This first linear transporter 6 is a mechanism that conveys the substrate between four conveying positions (which shall be referred to as first conveying position TP1, second conveying position TP2, third conveying position TP3 and fourth conveying position TP4, sequentially from right in the figure), which are provided along a direction in which the polishing units 3A and 3B are arrayed.

In addition, the second conveying mechanism 2B has a second linear transporter 7 which is arranged so as to be adjacent to the third polishing unit 3C and the fourth polishing unit 3D. This second linear transporter 7 is a mechanism that conveys the substrate between three conveying positions (which shall be referred to as fifth conveying position TP5, sixth conveying position TP6 and seventh conveying position TP7, sequentially from right in the figure), which are provided along a direction in which the polishing units 3C and 3D are arrayed.

The substrate is conveyed to the polishing units 3A and 3B, by the first linear transporter 6. The top ring 31A of the first polishing unit 3A is moved between the polishing position and the second conveying position TP2, by a swing operation of the head of the top ring. Accordingly, the substrate is delivered to the top ring 31A at the second conveying position TP2. Similarly, the top ring 31B of the second polishing unit 3B moves between the polishing position and the third conveying position TP3, and the substrate is delivered to the top ring 31B at the third conveying position TP3. The top ring 31C of the third polishing unit 3C moves between the polishing position and the sixth conveying position TP6, and the substrate is delivered to the top ring 31C at the sixth conveying position TP6. The top ring 31D of the fourth polishing unit 3D moves between the polishing position and the seventh conveying position TP7, and the substrate is delivered to the top ring 31D at the seventh conveying position TP7.

A lifter 18 for receiving the substrate from a not-shown conveying robot is arranged on the first conveying position TP1. The substrate is delivered to the first linear transporter 6 through this lifter 18 from the not-shown conveying robot. In addition, a swing transporter 12 is arranged in between the first linear transporter 6 and the second linear transporter 7. This swing transporter 12 has a hand which can move between the fourth conveying position TP4 and the fifth conveying position TP5, and the substrate is delivered to the second linear transporter 7 from the first linear transporter 6, by the swing transporter 12. The substrate is conveyed to the third polishing unit 3C and/or the fourth polishing unit 3D, by the second linear transporter 7.

The wet treatment apparatuses 10 and 11 of the CMP apparatus 1 according to the present embodiment are configured to be capable of being divided, in order to be carried into/from a clean room of a semiconductor manufacturing plant.

Figure 2:
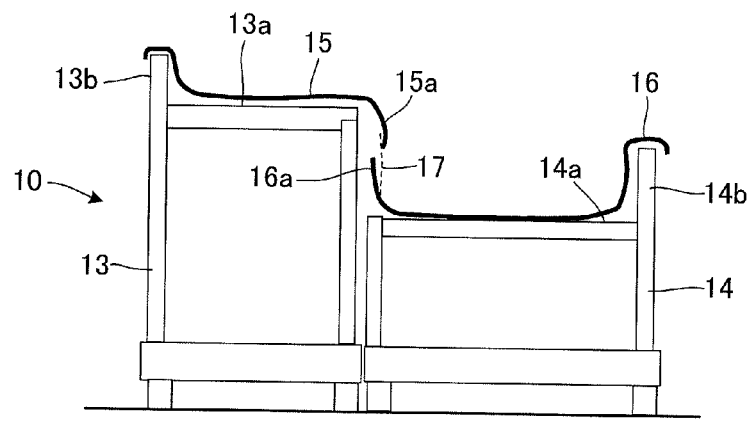
FIG. 2 is a schematic side view illustrating the wet treatment apparatus according to the present embodiment.

FIG. 2 is a schematic side view of the wet treatment apparatus 10 according to the present embodiment.

As is illustrated in FIG. 2, the wet treatment apparatus 10 is provided with: a first base frame 13 that is configured to be capable of mounting the first polishing unit 3A and the second polishing unit 3B (substrate treatment apparatus) thereon, which are illustrated in FIG. 1; and a second base frame 14 that is configured to be capable of mounting the first conveying mechanism 2A (substrate conveying apparatus) thereon, which is illustrated in FIG. 1, and that is arranged so as to be adjacent to the first base frame 13. In addition, a first waterproofing pan 15 that is designed so as to fit the size (occupation area) of a mounting surface 13a of the first base frame 13 is arranged on the mounting surface 13a (upper face) which mounts the substrate treatment apparatus thereon; and a second waterproofing pan 16 that is designed so as to fit the size (occupation area) of a mounting surface 14a of the second base frame 14 is arranged on the mounting surface 14a (upper face) which mounts the substrate conveying apparatus thereon.

A projecting portion 13b which is formed so as to project upwardly is provided on the outer peripheral side of the mounting surface 13a of the first base frame 13 (left side in figure); and the first waterproofing pan 15 is formed to curve so as to fit the shapes of the mounting surface 13a and the projecting portion 13b, and so that an end 15a in an adjacent side of the mounting surface 13a to the second base frame 14 (right side in figure) hangs down from the mounting surface 13a. Thereby, the treatment liquid which has flowed out from the substrate treatment apparatus and has been received by the first waterproofing pan 15 is configured to flow into the second waterproofing pan 16 through the end 15a.

The mounting surface 14a of the second base frame 14 is formed so as to be lower than the mounting surface 13a of the first base frame 13, and a projecting portion 14b which is formed so as to project upwardly is provided in the outer peripheral side of the mounting surface 14a (right side in figure). The second waterproofing pan 16 curves so as to fit the shapes of the mounting surface 14a and the projecting portion 14b, and an end 16a curves upwardly which is located in an adjacent side of the mounting surface 14a to the first base frame 13 (right side in figure). Thereby, the second waterproofing pan 16 prevents a treatment liquid which has flowed in from the first waterproofing pan 15 and a treatment liquid that has been received by the second waterproofing pan 16, from flowing out to the outside.

The first waterproofing pan 15 and the second waterproofing pan 16 are formed into an approximately rectangular shape in planar view. Here, in planar view means that, in a state where the first waterproofing pan 15 and the second waterproofing pan 16 are arranged on the first base frame 13 and the second base frame 14, respectively, the respective waterproofing pans are viewed from a plane parallel to the mounting surfaces of the base frames.

The end 15a of the first waterproofing pan 15 is configured so that at least one part of the end 15a overlaps the end 16a of the second waterproofing pan 16 in planar view, and the height of the end 15a is formed so as to be higher than that of the end 16a.

A plate-shaped structure 17 having flexibility is provided on the end 15a of the first waterproofing pan 15. The plate-shaped structure 17 is configured to cover a gap between the end 15a of the first waterproofing pan 15 and the end 16a of the second waterproofing pan 16, and can waterproof the space between the end 15a of the first waterproofing pan 15 and the end 16a of the second waterproofing pan 16.

The shape of the plate-shaped structure 17 is rectangular in the present embodiment. In addition, the plate-shaped structure 17 has a plurality of slits in approximately parallel (depth direction in figure) to the end 15a of the first waterproofing pan 15 formed therein so that the plate-shaped structure 17 easily curves.

The plate-shaped structure 17 is attached to the end 15a of the first waterproofing pan 15, for instance, by bonding, welding, riveting or screwing.

The materials of the first waterproofing pan 15 and the second waterproofing pan 16 include, for instance, hard polyvinyl chloride (PVC) and metal such as stainless steel.

The plate-shaped structure 17 is formed from a material which has lower rigidity than the material of the first waterproofing pan 15 and the second waterproofing pan 16, and has flexibility. The material having the lower rigidity is, for instance, a synthetic resin such as a soft vinyl chloride, PFA (tetrafluoroethylene/perfluoroalkyl vinyl ether copolymer), PTFE (polytetrafluoro-ethylene), rubber and plastic, or a metal. In addition, the plate-shaped structure 17 may also be a woven fabric or a non-woven fabric which is made from a known material having lower rigidity than the material of the first waterproofing pan 15 and the second waterproofing pan 16, or a plate-shaped (sheet-shaped) structure of the woven fabric or the non-woven fabric, which contains a resin.

A process of assembling the wet treatment apparatus 10 will be described below.

Figure 3:
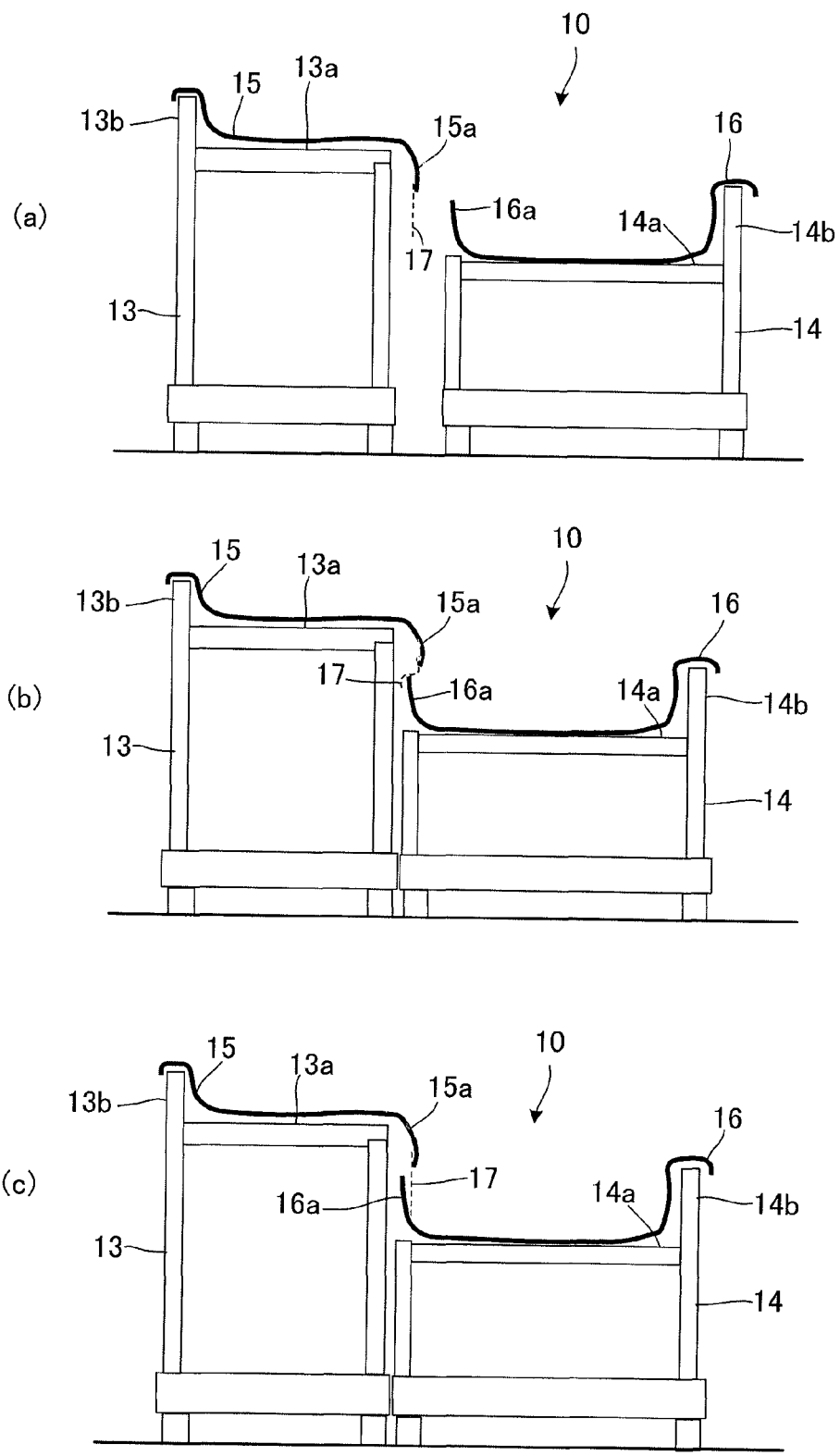
FIG. 3 shows views for describing a process of assembling the wet treatment apparatus according to the present embodiment.

FIG. 3 is a view for describing the process of assembling the divided wet treatment apparatus 10.

As is illustrated in FIG. 3A, the first base frame 13 and the second base frame 14 are carried into a clean room or the like, in the state in which the first waterproofing pan 15 and the second waterproofing pan 16 are previously installed on the first base frame 13 and the second base frame 14, respectively. In addition, the plate-shaped structure 17 is previously attached to the end 15a of the first waterproofing pan 15.

When the wet treatment apparatus 10 is assembled, the first base frame 13 is arranged so as to be adjacent to the second base frame 14 while being hoisted, for instance, by a not-shown crane (see FIG. 3B). Alternatively, it is also acceptable to slide and move the first base frame 13 so as to be adjacent to the second base frame 14, without hoisting the first base frame 13.

At this time, even though the first base frame 13 has been moved so as to be adjacent to the second base frame 14, the end 15a of the first waterproofing pan 15 does not come in contact with the end 16a of the second waterproofing pan 16, because the height of the end 15a of the first waterproofing pan 15 is configured to be higher than the height of the end 16a of the second waterproofing pan 16, and each of the waterproofing pans can be surely prevented from being damaged.

The plate-shaped structure 17 which is attached to the end 15a of the first waterproofing pan 15 comes in contact with the end 16a of the second waterproofing pan 16, and is curved (see FIG. 3B).

At this time, even though having come in contact with the second waterproofing pan 16, the plate-shaped structure 17 does not damage the second waterproofing pan 16, because the plate-shaped structure 17 is formed from a material which is softer than the materials of the first waterproofing pan 15 and the second waterproofing pan 16. In addition, the plate-shaped structure 17 has flexibility, specifically, has flexibility in such a degree as to be capable of being curved; and is configured to be deformed as needed, and so as not to be damaged even though having come in contact with the second waterproofing pan 16. In addition, the plate-shaped structure 17 has the slits formed therein as has been described above, and accordingly can more flexibly curve, which can more surely prevent the plate-shaped structure 17 and the second waterproofing pan 16 from being mutually damaged due to the contact.

When the first base frame 13 is moved to an assembly completion position, the curved plate-shaped structure 17 returns to the original shape, and simultaneously covers the end 16a of the second waterproofing pan 16 (see FIG. 3C). Thereby, the gap between the end 15a of the first waterproofing pan 15 and the end 16a of the second waterproofing pan 16 can be surely waterproofed.

The wet treatment apparatus 10 according to the present embodiment can surely waterproof a gap between the first waterproofing pan 15 and the second waterproofing pan 16 with the plate-shaped structure 17, and can be easily assembled without damaging the first waterproofing pan 15 and the second waterproofing pan 16.

In addition, because the end 15a of the first waterproofing pan 15 is configured so that at least one part of the end 15a overlaps the end 16a of the second waterproofing pan 16 in planar view, and the plate-shaped structure 17 is attached to this end 15a, a treatment liquid received by the first waterproofing pan 15 surely flows into the second waterproofing pan 16 through the plate-shaped structure 17, which accordingly can prevent the leakage of the treatment liquid.

Furthermore, the wet treatment apparatus 10 can be assembled in a state in which the plate-shaped structure 17 is previously attached to the first waterproofing pan 15, and accordingly it is not necessary to attach the plate-shaped structure 17 on-site, which can shorten an on-site operation period of time.

Incidentally, in the present embodiment, the plate-shaped structure 17 is not fixed to the second waterproofing pan 16, but may also be attached to the second waterproofing pan 16 by bonding, welding, riveting, screwing or the like, as needed.

In addition, in the present embodiment, the plate-shaped structure 17 is attached to the end 15a of the first waterproofing pan 15 which is arranged at a relatively high position, but may also be attached to the end 16a of the second waterproofing pan 16 instead of the end 15a. In this case, a material having rigidity in such a degree as to be capable of self-sustaining in a vertical direction, in the state in which the plate-shaped structure 17 is attached to the end 16a of the second waterproofing pan 16, is selected for the plate-shaped structure 17.

Figure 4:
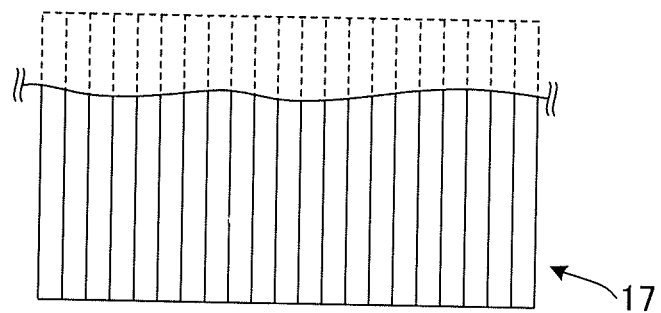
FIG. 4 shows plan views of other structures which are attached on the end of a first waterproofing pan.
Figure 4:
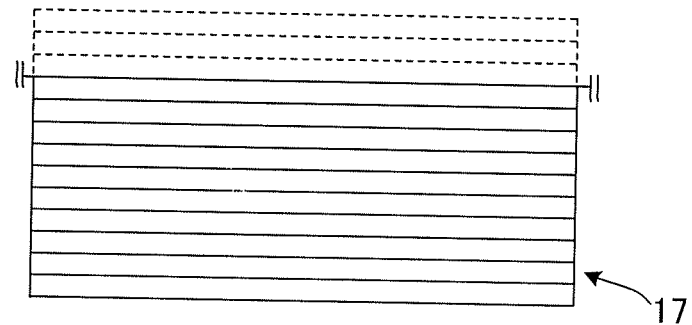

Furthermore, in place of the plate-shaped structure 17, for instance, a structure 17 (see FIG. 4A) may be provided which has a brush shape formed by attaching ends of a plurality of rod-shaped bodies or cylindrical bodies having flexibility to the end 15a of the first waterproofing pan 15, and densely arranging the bodies, or a structure 17 (see FIG. 4B) may also be provided which has a blinds shape formed by connecting a plurality of rod-shaped bodies or cylindrical bodies having flexibility in an in-plane direction. For information, the brush-shaped structure 17 and the blinds-shaped structure 17 can be formed from a material, similarly to the plate-shaped structure 17, which has lower rigidity than the material of the first waterproofing pan 15 and the second waterproofing pan 16, and has flexibility. The material having the lower rigidity is, for instance, a synthetic resin such as a soft vinyl chloride, PFA, PTFE, rubber and plastic, or a metal.

Figure 5:
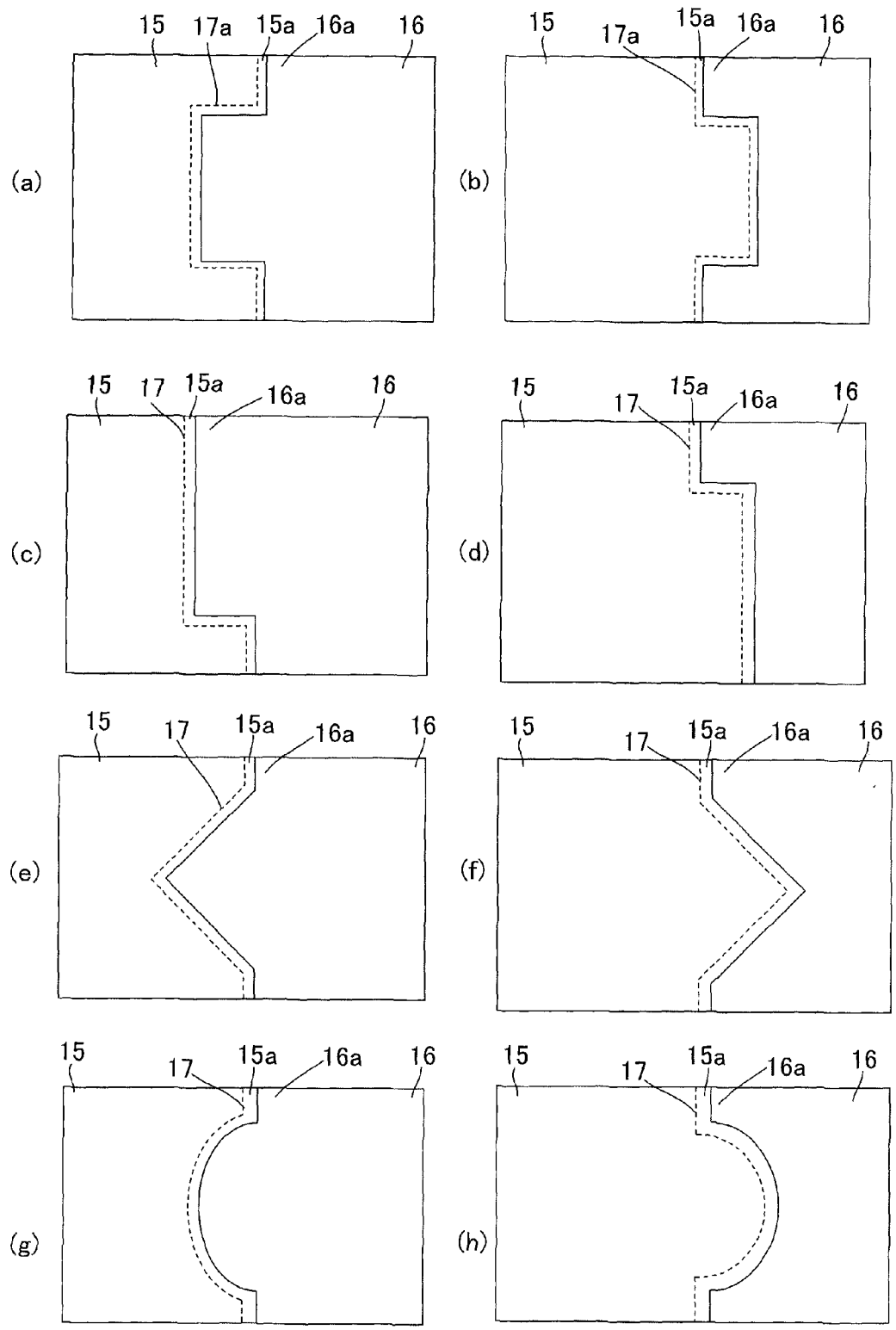
FIG. 5 shows plan views illustrating examples of shapes of the first waterproofing pan and a second waterproofing pan.
Figure 6:
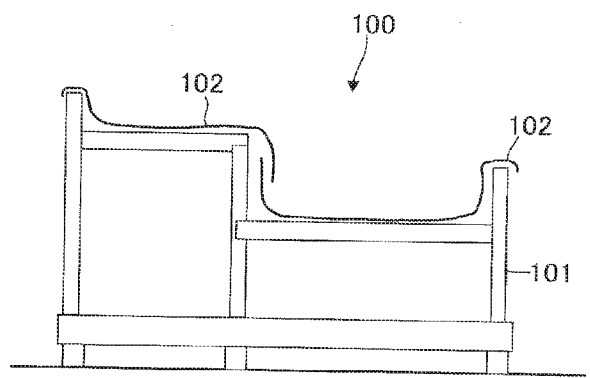
FIG. 6 is a schematic side view illustrating an example of a conventional wet treatment apparatus.
Figure 7:
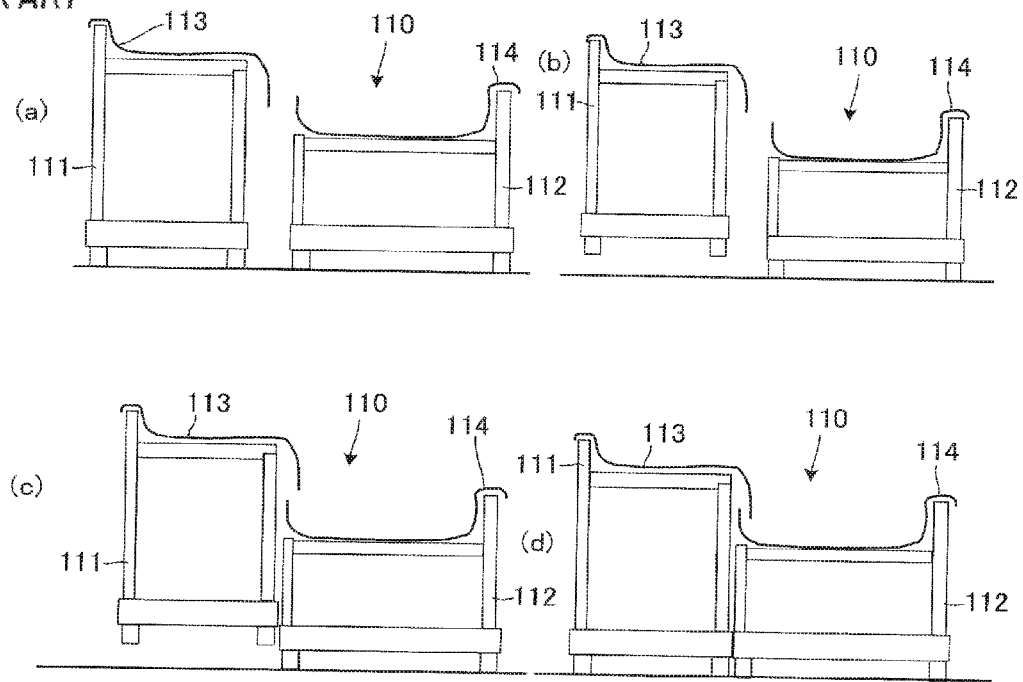
FIG. 7 shows views for describing a process of assembling the conventional wet treatment apparatus.

In the present embodiment, the end 15a of the first waterproofing pan 15 and the end 16a of the second waterproofing pan 16 are formed into an approximately rectangular shape in planar view, but may also have a more complicated shape. For instance, as is illustrated in FIG. 5, the end 15a and the end 16a may also have such a shape as to be engaged with each other to form a rectangular shape (see FIG. 5A to FIG. 5D); such a shape that parts of the end 15a and the end 16a are engaged with each other to form a sharp angle (see FIG. 5E and FIG. 5F); or such a shape that parts of the end 15a and the end 16a are engaged with each other to form a circular arc (see FIG. 5G and FIG. 5H). In these cases, the plate-shaped structure 17 is attached to the end 15a along the shape of the end 15a, as is illustrated by dashed lines shown in the figures. Thus, when the plate-shaped structure 17 is provided along the shape of the end 15a, a gap between the end 15a and the end 16a is surely waterproofed.

REFERENCE SIGNS LIST

1 CMP apparatus, 2A first conveying mechanism, 2B second conveying mechanism, 3A first polishing unit, 3B second polishing unit, 3C third polishing unit, 3D fourth polishing unit, 6 first linear transporter, 7 second linear transporter, 10, 11, 100 and 110 wet treatment apparatus, 13 and 111 first base frame, 13a mounting surface, 13b projecting portion, 14 and 112 second base frame, 14a mounting surface, 14b projecting portion, 15 and 113 first waterproofing pan, 15a end, 16 and 114 second waterproofing pan, 16a end, 17 plate-shaped structure, 20 polishing pad, 30A, 30B, 30C and 30D polishing table, 31A, 31B, 31C and 31D top ring, 32A, 32B, 32C and 32D polishing-liquid supplying nozzle, 33A, 33B, 33C and 33D dresser, 34A, 34B, 34C and 34D atomizer, 102 waterproofing pan.

What is claimed is:

1. A wet treatment apparatus comprising:
a first base frame;
a second base frame separable from the first base frame and arranged adjacent to the first base frame in a lateral direction;
a first waterproofing pan installed on an upper face of the first base frame; and
a second waterproofing pan installed on an upper face of the second base frame,
wherein the first waterproofing pan has an end, the second waterproofing pan has an end extending upwardly, the end of the first waterproofing pan and the end of the second waterproofing pan are arranged to overlap each other at least in planer view, and the end of the first waterproofing pan is arranged in a higher position than the end of the second waterproofing pan, the wet treatment apparatus further comprises a structure attached to the first waterproofing pan or the second waterproofing pan, and
the structure extends in a vertical direction, has a length longer than a gap in a vertical direction between the first waterproofing pan and the second waterproofing pan, is configured to waterproof the gap between the first waterproofing pan and the second waterproofing pan, and has flexibility.

2. The wet treatment apparatus according to claim 1, wherein
the structure is attached to the end of the first waterproofing pan or the end of the second waterproofing pan.

3. The wet treatment apparatus according to claim 1, wherein the structure is formed from synthetic resin or metal, and has lower rigidity than the first base frame and the second base frame.

4. The wet treatment apparatus according to claim 1, wherein the structure is formed into a plate shape, a brush shape or a blinds shape.

5. The wet treatment apparatus according to claim 1, wherein
the first base frame is configured to be capable of mounting a substrate treatment apparatus thereon, and
the second base frame is configured to be capable of mounting a substrate conveying apparatus thereon.

6. A substrate treatment apparatus comprising the wet treatment apparatus according to claim 1.

7. The wet treatment apparatus according to claim 1, wherein the structure is attached to the end of the first waterproofing pan, and extends to a lower position than a tip of the end extending upwardly of the second waterproofing pan.

8. The wet treatment apparatus according to claim 1, wherein the end of the first waterproofing pan extends downwardly.

9. The wet treatment apparatus according to claim 1, wherein the structure is attached to the end of the second waterproofing pan, and extends to a higher position than a tip of the end extending downwardly of the first waterproofing pan.

10. A wet treatment apparatus comprising:
a first base frame;
a second base frame separable from the first base frame and arranged adjacent to the first base frame in a lateral direction;
a first waterproofing pan installed on an upper face of the first base frame; and
a second waterproofing pan installed on an upper face of the second base frame,
wherein the first waterproofing pan has an end, the second waterproofing pan has an end extending upwardly, the end of the first waterproofing pan and the end of the second waterproofing pan are arranged to overlap each other at least in planer view, and the end of the first waterproofing pan is arranged in a higher position than the end of the second waterproofing pan,
the wet treatment apparatus further comprises at least one of a flexible plate, a flexible brush, and a flexible blinds attached to the first waterproofing pan or the second waterproofing pan,
the at least one of the flexible plate, the flexible brush, and the flexible blinds extends in a vertical direction, has a length longer than a gap in a vertical direction between the first waterproofing pan and the second waterproofing pan, and is configured to cover the gap between the first waterproofing pan and the second waterproofing pan.

11. The wet treatment apparatus according to claim 10, wherein the at least one of the flexible plate, the flexible brush, and the flexible blinds is attached to the end of the first waterproofing pan or the end of the second waterproofing pan.

12. The wet treatment apparatus according to claim 10, wherein the at least one of the flexible plate, the flexible brush, and the flexible blinds is formed from synthetic resin or metal, and has lower rigidity than the first base frame and the second base frame.

\* \* \* \* \*